United States Patent
Sjöland et al.

(10) Patent No.: US 12,438,548 B2
(45) Date of Patent: Oct. 7, 2025

(54) MULTIPLE PLL SYSTEM WITH PHASE LOCKING AND PHASE NOISE CANCELLATION

(71) Applicant: Telefonaktiebolaget LM Ericsson (publ), Stockholm (SE)

(72) Inventors: Henrik Sjöland, Lund (SE); Staffan Ek, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 49 days.

(21) Appl. No.: 18/283,798

(22) PCT Filed: Mar. 26, 2021

(86) PCT No.: PCT/EP2021/058001
§ 371 (c)(1),
(2) Date: Sep. 23, 2023

(87) PCT Pub. No.: WO2022/199852
PCT Pub. Date: Sep. 29, 2022

(65) Prior Publication Data
US 2024/0297655 A1    Sep. 5, 2024

(51) Int. Cl.
*H03L 7/099*    (2006.01)
*H03L 7/093*    (2006.01)

(52) U.S. Cl.
CPC ............ *H03L 7/0992* (2013.01); *H03L 7/093* (2013.01)

(58) Field of Classification Search
CPC ....... H03L 7/0992; H03L 7/23; H03L 7/0805; H03L 7/093; H03L 7/099; H03L 2207/06
See application file for complete search history.

(56) References Cited

U.S. PATENT DOCUMENTS 5,329,251 A    7/1994    Llewellyn
5,909,474 A    6/1999    Yoshizawa
(Continued)

FOREIGN PATENT DOCUMENTS

EP    0780985 A1    6/1997
EP    2264903 A1    12/2010
(Continued)

OTHER PUBLICATIONS

Anand Iyer, S.P. et al., "Phase-Frequency Synthesis Using PLL-Networks", 2008 Joint 6th International IEEE Northeast Workshop on Circuits and Systems and TAISA Conference, Jun. 22-25, 2008, pp. pp. 5-8, IEEE.
(Continued)

*Primary Examiner* — Dac V Ha
(74) *Attorney, Agent, or Firm* — COATS & BENNETT, PLLC

(57) ABSTRACT

An integrated, distributed, multiple Phase Locked Loop (multi-PLL) system locks the frequency and phase of multiple secondary PLLs to that of a primary PLL. The VCOs in all PLLs receive both first and second control signals. The primary PLL's primary VCO control signal is generated conventionally. using a reference periodic signal input, and is output to all secondary PLLs: hence the secondary PLLs operate at the primary PLL frequency. The primary PLL also outputs its divided periodic signal. Each secondary PLL compares its local divided periodic signal to the one received from the primary PLL (rather than to a reference signal input) in its phase locking loop. generating a secondary VCO input that locks the secondary PLL circuit phase to that of the primary PLL circuit. Selected secondary PLLs can be set to a phase offset from the primary PLL, such as by controlled DC current injected into the charge pump output. Phase noise generated by the primary PLL VCO is (Continued)

detected and corrected by one or more secondary PLLs in a second charge pump circuit that outputs a correction current having an inverse polarity. The correction currents are summed, and a correction loop filter generates a third VCO control signal which is provided to the second primary VCO input to correct the phase noise. Either the charge pumps scale output current (1/N) or the correction loop filter scales impedance (1/N) to account for the number (N) of secondary PLLs generating correction currents. A common mode voltage circuit may monitor selected VCO control signals of all PLLs. and maintains the common mode input level within a predetermined voltage range.

19 Claims, 8 Drawing Sheets

(56) References Cited

U.S. PATENT DOCUMENTS

| | | | |
|---|---|---|---|
| 5,943,380 | A | 8/1999 | Marchesani et al. |
| 5,977,806 | A | 11/1999 | Kikuchi |
| 6,314,074 | B1 | 11/2001 | Kuribayashi |
| 6,337,891 | B1 | 1/2002 | Kim |
| 7,860,190 | B2 | 12/2010 | Feller |
| 8,406,366 | B2 | 3/2013 | Hattori et al. |
| 8,415,999 | B2 | 4/2013 | Ding et al. |
| 9,225,507 | B1 | 12/2015 | Fye et al. |
| 10,200,049 | B2 * | 2/2019 | Bisanti .................. H03L 7/185 |
| 10,931,498 | B1 | 2/2021 | Dorosenco |
| 11,171,656 | B2 * | 11/2021 | Grout .................... H03L 7/087 |
| 11,671,104 | B2 * | 6/2023 | Tak ....................... H03L 7/0891 375/376 |
| 11,677,405 | B2 | 6/2023 | Sjoland |
| 2008/0232531 | A1 | 9/2008 | Feller |
| 2010/0102889 | A1 | 4/2010 | Azenkot et al. |
| 2011/0248755 | A1 * | 10/2011 | Hasenplaugh .......... H03L 7/087 327/156 |
| 2019/0131979 | A1 | 5/2019 | Nilsson |
| 2021/0044472 | A1 | 2/2021 | Dorosenco et al. |
| 2022/0085821 | A1 | 3/2022 | Gao |

FOREIGN PATENT DOCUMENTS

| | | |
|---|---|---|
| EP | 2819131 A1 | 12/2014 |
| EP | 2843839 A1 | 3/2015 |
| EP | 2819131 B1 | 8/2019 |
| EP | 2843839 B1 | 3/2020 |
| JP | H0983587 A | 3/1997 |
| JP | 2004072714 A | 3/2004 |
| JP | 2020027966 A | 2/2020 |
| TW | 201225544 A | 6/2012 |
| WO | 2021121637 A1 | 6/2021 |
| WO | 2022262995 A1 | 12/2022 |

OTHER PUBLICATIONS

Agrawal, A. et al., "A Scalable 28GHz Coupled-PLL in 65nm CMOS with Single-Wire Synchronization for Large-Scale 5G mm-Wave Arrays", 2016 IEEE International Solid-State Circuits Conference, Digest of Technical Papers, Feb. 1, 2016, pp. 38-40, IEEE.
Razavi, B., "A Study of Injection Locking and Pulling in Oscillators", IEEE Journal of Solid-State Circuits, vol. 39, No. 9, Sep. 2004, pp. 1415-1424, IEEE.

* cited by examiner

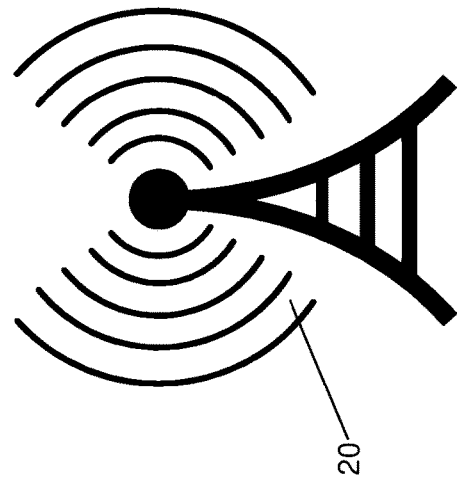
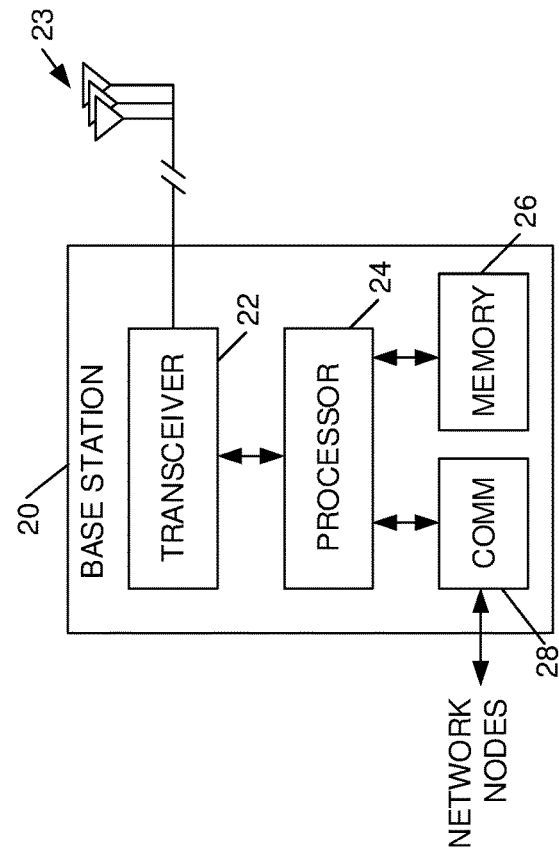
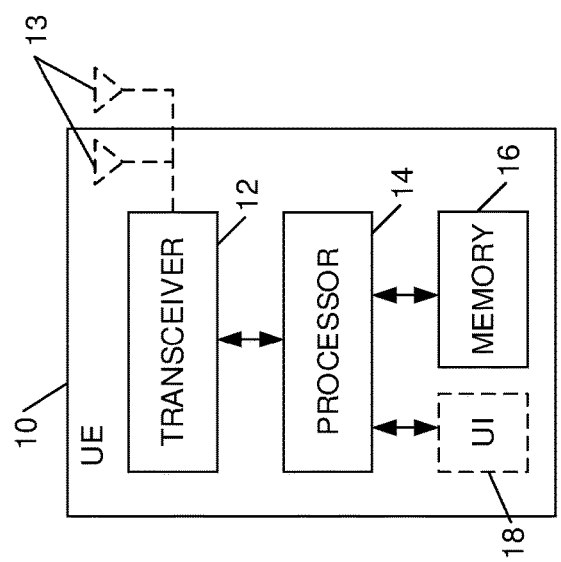
FIGURE 10A
FIGURE 10B
FIGURE 10C

MULTIPLE PLL SYSTEM WITH PHASE LOCKING AND PHASE NOISE CANCELLATION

TECHNICAL FIELD

The present invention relates generally to periodic signal circuits, and in particular to a system of distributed Phase Locked Loops (PLL) having one primary and a plurality of secondary PLLs.

BACKGROUND

Wireless communication networks, including network nodes and radio network devices such as cellphones and smartphones, are ubiquitous in many parts of the world. These networks continue to grow in capacity and sophistication. To accommodate both more users and a wider range of types of devices that may benefit from wireless communications, the technical standards governing the operation of wireless communication networks continue to evolve. The fourth generation of network standards has been deployed (4G, also known as Long Term Evolution, or LTE), the fifth generation is in development (5G, also known as New Radio, or NR), and the sixth generation (6G) is being planned.

One important development in modern wireless communication networks is the use of spatial diversity and/or spatial multiplexing. Spatial diversity refers to transmitting the same signal on different propagation paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. 4G network standards contemplate 2, 4, or 8 antennas per transceiver; 5G networks envision up to 128 antennas per transceiver; and the number could go far higher in 6G networks. In highly parallel architectures, each antenna used to transmit or receive an RF signal is associated with a dedicated transceiver. Each transceiver requires a Local Oscillator (LO) signal to perform frequency conversion between carrier frequencies (for transmission/reception) and baseband (for signal processing). For efficient, low power processing of received signals, and for the transmission of coherent signals from multiple antennas, phase coherence of the multiple LO signals is important.

Another advanced feature of modern wireless communication networks is beamforming, wherein the directionality of an RF transmission is increased and controlled to "aim" in a specific direction. This may be accomplished by the use of a phased-array antenna comprising a large plurality of antenna elements. The relative phases of transmit signals sent to each antenna element are controlled to create constructive or destructive interference, thus amplifying the signal in some directions and attenuating it in others, and hence controlling the direction in which the beam is transmitted. Similar phase manipulation of signals from antenna elements in a receive antenna can also result in beamforming the sensitivity of a phased-array antenna in receiving signals. In such beamforming systems, the LO signals at each antenna element transceiver must be phase-aligned, to allow for precise control of the phase offsets.

Typically, an LO signal is generated using a phase locked loop (PLL). A PLL is a well-known circuit, in which a Controlled Oscillator (i.e., an analog Voltage Controlled Oscillator, VCO, or a Digitally Controlled Oscillator, DCO) generates a high-frequency periodic signal, such as an LO signal. The generated periodic signal is at a frequency that is a predetermined multiple of a reference signal, such as a clock signal from a crystal oscillator or other accurate source. In a feedback loop within the PLL, a Phase Detector compares a frequency-divided version of the VCO/DCO output signal with the reference signal, to generate an error signal indicative of phase deviation. The error signal is processed by a loop filter, providing an input to the VCO/DCO that keeps the output signal phase-locked to the reference signal. The output frequency of the PLL may be changed by changing frequency of the reference signal input, or by adjusting the divisor in the frequency division circuit.

As indicated above, a PLL may operate in the analog or digital domain. Advantages of a digital PLL include the absence of large area capacitors in the analog loop filter, and the possibility to support advanced digital algorithms, such as to implement high-speed frequency hops. On the other hand, advantages of an analog PLL include reduced design complexity and excellent phase noise. As one example of the design trade-offs, the simplicity of an analog PLL makes it an excellent choice at very high frequencies or for very low power. However, this choice sacrifices the possibility for digital algorithms to achieve improved performance. Regardless of the PLL architecture selected, however, a key concern is achieving sufficiently low phase noise, with limited power consumption and chip area, without sacrificing performance in other aspects.

Whether an analog or digital PLL architecture is selected, there are different options for distributing an LO signal to a large number of transceivers across an Integrated Circuit (IC). One option is to employ a single, very high performance PLL, and distribute one LO signal over the IC to each transceiver. Another option is to provide a separate PLL at each transceiver. Numerous intermediate options are possible, in which two or more PLLs, distributed over the IC, each provide an LO signal to some number of nearby transceivers. Each design option has advantages and disadvantages.

A single PLL provides the advantages of providing correlated phase noise to all transceivers, and no deleterious effects from the interaction of multiple PLLs operating at the same frequency. However, the noise performance requirements of a single PLL then becomes stringent, and routing a high-frequency LO signal presents numerous known challenges (e.g., high power consumption, and maintaining phase match and low phase-noise through multiple buffers).

There are several advantages to the use of multiple PLLs (whether one per transceiver or one per multiple transceivers). Their phase noises are non-correlated, other than noise originating from the common reference signal. Hence, the phase noise requirement of each PLL can be relaxed, and sufficient system performance can still be achieved when the signals are combined by their use in different transceivers. Although the total power consumption of multiple PLLs may be on par with that of a single PLL, considerable power consumption reduction can be realized by eliminating the LO signal distribution network. Furthermore, elimination of the LO distribution network makes the entire design more modular, allowing for the addition or removal of PLLs with minimal design effort. On the other hand, the use of multiple PLLs raises a risk of undesired interaction between them, particularly in cases where the IC is so compact that distances between the inductors of the oscillators are limited.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present invention described and claimed herein provide an integrated, distributed, multiple Phase Locked Loop (multi-PLL) system, such as for generating multiple copies of a Local Oscillator (LO) signal on an Integrated Circuit (IC). These embodiments may find particular utility in the transceivers of wireless communication network base stations and/or User Equipment, particularly those operating in the millimeter wave frequency bands. The multi-PLL system locks the frequency and phase of multiple secondary PLLs to that of the output of a primary PLL. The control signals distributed between the various PLLs are of relatively low frequency, minimizing interference and preserving design modularity. The bandwidths of different control loops are set independently, achieving good phase noise performance while still suppressing oscillator coupling effects. The multi-PLL system comprises one primary PLL generating a first periodic signal, and one or more secondary PLLs each generating a periodic signal having a frequency and phase locked to that of the primary PLL. The VCOs in all PLLs have both first and second control inputs. The primary PLL's first VCO input is generated conventionally in the primary PLL, by comparing a divided periodic signal to a reference periodic signal input. The primary PLL outputs this first VCO input to all secondary PLLs; hence the secondary PLLs output a periodic signal at close to the same frequency as the primary PLL. To lock the secondary PLL outputs to the phase of the primary PLL output, and thus make their frequencies the same, the primary PLL also outputs its divided periodic signal. Each secondary PLL compares its local divided periodic signal to the divided periodic signal received from the primary PLL (rather than to a reference signal input) in its phase locking loop, generating a second VCO input which locks the secondary PLL output phase to that of the primary PLL. Selected secondary PLLs can be set to a phase offset from the primary PLL, such as by controlled DC current injected into the charge pump output. This phase locking loop of the secondary PLLs preferably has a higher bandwidth than the primary PLL, and even when the secondary PLLs are placed in proximity and phase offsets are induced, the multi-PLL system counters effects of mutual inductance (coupling) between the VCOs, and maintains stable phase signals.

Phase noise generated by the primary PLL VCO is detected and corrected by one or more secondary PLLs. The secondary PLLs include a second charge pump circuit, which outputs a phase noise correction current having an inverse polarity. The phase noise correction currents are summed, and a phase noise correction loop filter generates a second VCO input for the primary PLL from the combined noise correction currents. In one embodiment the phase noise correction current output by each of N secondary PLLs is scaled by 1/N. In another embodiment the impedance of the phase noise correction loop filter is scaled by 1/N, where N secondary PLLs output a phase noise correction current. A common mode voltage circuit monitors the second VCO inputs of all PLLs, and maintains the common mode level of the inputs close to a predetermined voltage.

One embodiment relates to a system. The system includes a primary Phase Locked Loop (PLL) circuit configured to receive a periodic reference signal at a first frequency and to output a first periodic signal at a second frequency. The primary PLL circuit comprises a Voltage Controlled Oscillator (VCO) circuit configured to output the first periodic signal at the second frequency dependent on a first VCO control signal generated in the primary PLL and applied at a first VCO input. The system also includes a plurality of secondary PLL circuits, each configured to receive a divided periodic signal from the primary PLL circuit. Each secondary PLL circuit is further configured to output a respective periodic signal at the second frequency. Each secondary PLL circuit comprises a VCO circuit configured to output the second periodic signal at the second frequency dependent on the first VCO control signal applied at a first VCO input and a second VCO control signal generated in the secondary PLL and applied at a second VCO input. At least one secondary PLL circuit is further configured to output a correction current. The system further includes a correction loop filter circuit configured to receive a combined correction current, comprising a sum of correction currents from one or more secondary PLL circuits, and output a third VCO control signal to a second VCO input of the primary PLL circuit. The primary VCO circuit is further configured to output the first periodic signal dependent on the third VCO control signal.

Another embodiment relates to a method of generating a plurality of periodic signals. A first periodic signal is generated at a second frequency in a primary Phase Locked Loop (PLL) circuit configured to receive a periodic reference signal at a first frequency. One or more respective periodic signals are generated at the second frequency in one or more respective secondary PLL circuits, each configured to receive a first Voltage Controlled Oscillator (VCO) control signal and a divided periodic signal from the primary PLL circuit. At least one secondary PLL circuit is further configured to output a correction current. A control input for a VCO of the primary PLL is generated in a correction loop filter circuit configured to receive a combined correction current, comprising a sum of correction currents from one or more secondary PLL circuits.

Yet another embodiment relates to an Integrated Circuit (IC) having a system configured to generate a plurality of periodic signals. The system includes a primary Phase Locked Loop (PLL) circuit configured to receive a periodic reference signal at a first frequency and to output a first periodic signal at a second frequency. The primary PLL circuit comprises a Voltage Controlled Oscillator (VCO) circuit configured to output the first periodic signal at the second frequency dependent on a first VCO control signal generated in the primary PLL and applied at a first VCO input. The system also includes a plurality of secondary PLL circuits, each configured to receive a divided periodic signal from the primary PLL circuit. Each secondary PLL circuit is further configured to output a respective periodic signal at the second frequency. Each secondary PLL circuit comprises a VCO circuit configured to output the second periodic signal at the second frequency dependent on the first VCO control signal applied at a first VCO input and a second VCO control signal generated in the secondary PLL and applied at a second VCO input. At least one secondary PLL circuit is further configured to output a correction current. The system further includes a correction loop filter circuit configured to receive a combined correction current, comprising a sum of correction currents from one or more secondary PLL circuits, and output a third VCO control signal to a second VCO input of the primary PLL circuit. The primary VCO circuit is further configured to output the first periodic signal dependent on the third VCO control signal.

Still another embodiment relates to User Equipment (UE) operative in a wireless communication network. The UE includes one or more transceiver circuits. At least one transceiver circuit includes a primary Phase Locked Loop (PLL) circuit configured to receive a periodic reference signal at a first frequency and to output a first periodic signal at a second frequency. The primary PLL circuit comprises a Voltage Controlled Oscillator (VCO) circuit configured to output the first periodic signal at the second frequency dependent on a first VCO control signal generated in the primary PLL and applied at a first VCO input. The transceiver circuit also includes a plurality of secondary PLL circuits, each configured to receive a divided periodic signal from the primary PLL circuit. Each secondary PLL circuit is further configured to output a respective periodic signal at the second frequency. Each secondary PLL circuit comprises a VCO circuit configured to output the second periodic signal at the second frequency dependent on the first VCO control signal applied at a first VCO input and a second VCO control signal generated in the secondary PLL and applied at a second VCO input. At least one secondary PLL circuit is further configured to output a correction current. The transceiver circuit further includes a correction loop filter circuit configured to receive a combined correction current, comprising a sum of correction currents from one or more secondary PLL circuits, and output a third VCO control signal to a second VCO input of the primary PLL circuit. The primary VCO circuit is further configured to output the first periodic signal dependent on the third VCO control signal.

Still another embodiment relates to a base station operative in a wireless communication network. The base station includes one or more transceiver circuits. At least one transceiver circuit includes a primary Phase Locked Loop (PLL) circuit configured to receive a periodic reference signal at a first frequency and to output a first periodic signal at a second frequency. The primary PLL circuit comprises a Voltage Controlled Oscillator (VCO) circuit configured to output the first periodic signal at the second frequency dependent on a first VCO control signal generated in the primary PLL and applied at a first VCO input. The transceiver circuit also includes a plurality of secondary PLL circuits, each configured to receive a divided periodic signal from the primary PLL circuit. Each secondary PLL circuit is further configured to output a respective periodic signal at the second frequency. Each secondary PLL circuit comprises a VCO circuit configured to output the second periodic signal at the second frequency dependent on the first VCO control signal applied at a first VCO input and a second VCO control signal generated in the secondary PLL and applied at a second VCO input. At least one secondary PLL circuit is further configured to output a correction current. The transceiver circuit further includes a correction loop filter circuit configured to receive a combined correction current, comprising a sum of correction currents from one or more secondary PLL circuits, and output a third VCO control signal to a second VCO input of the primary PLL circuit. The primary VCO circuit is further configured to output the first periodic signal dependent on the third VCO control signal.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 10A is a diagram of MIMO transmission on the air interface of a wireless communication network.

FIG. 10B is a hardware block diagram of the UE of FIG. 9A.

FIG. 10C is a hardware block diagram of the base station of FIG. 9A.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
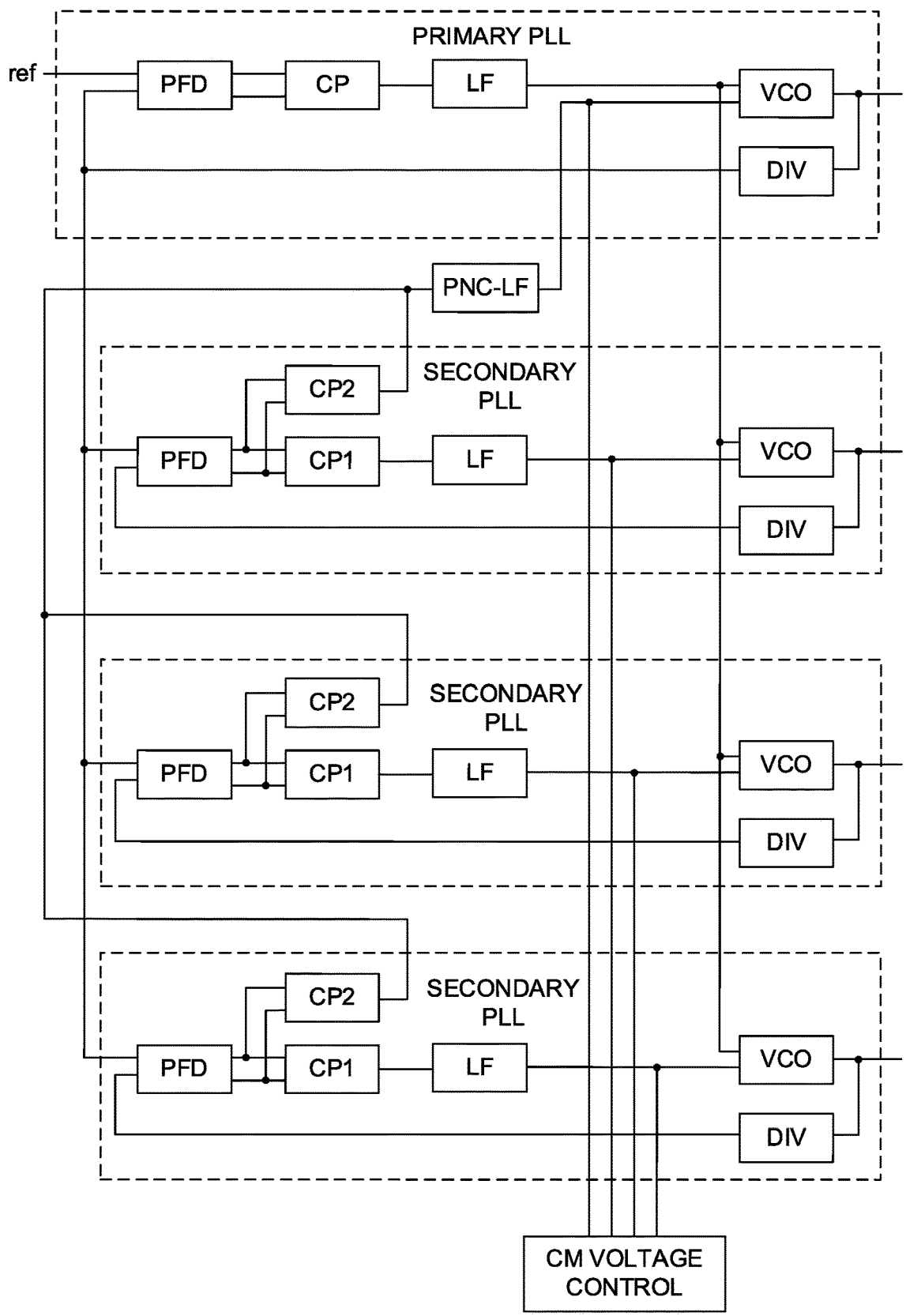
FIG. 1 is a block diagram of a multi-PLL system comprising one primary and multiple secondary PLLs on an IC.

FIG. 1 depicts a block diagram of a multiple-Phase Locked Loop (multi-PLL) system implemented on an Integrated Circuit. The system comprises one primary PLL circuit, a plurality of secondary PLLs, a phase noise correction loop filter (PNC-LF), and a Common Mode (CM)

voltage control circuit. The embodiment depicted in FIG. 1 includes three secondary PLLs; in other implementations there may be (many) more. Also, in the embodiment depicted, all three secondary PLLs participate in a distributed phase noise correction loop by outputting phase noise correction currents, which are summed and input to the PNC-LF. In other implementations, one or more secondary PLLs may not output phase noise correction currents. In general, in the discussion herein, reference to a number N of secondary PLLs refers to the N secondary PLLs outputting phase noise correction currents, although there may be one or more secondary PLLs locked to the frequency of the primary PLL but which do not output phase noise correction currents. Only the core functional blocks of the PLLs are depicted for simplicity—those of skill in the art are aware that any actual PLL circuit may include additional circuitry beyond that depicted in FIG. 1.

Figure 2:
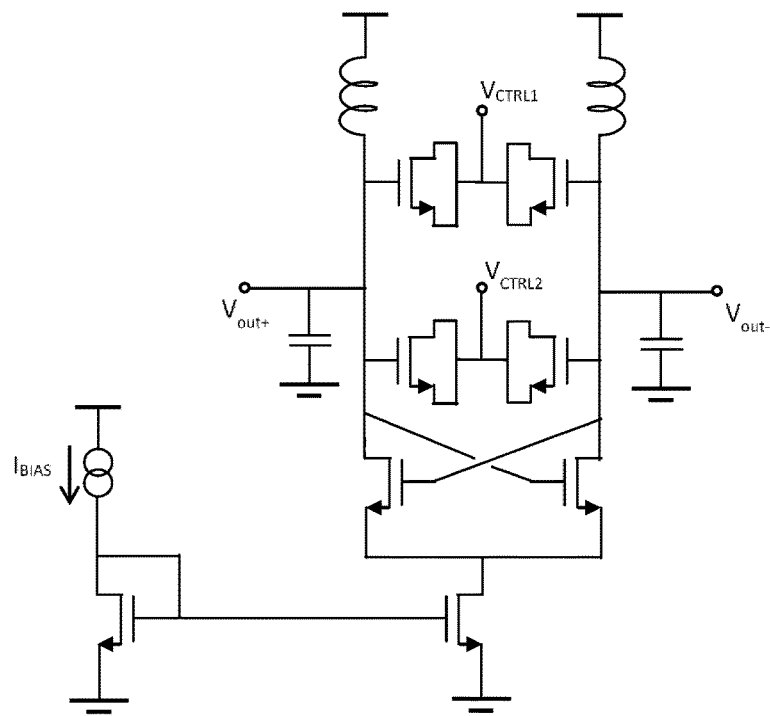
FIG. 2 is a schematic diagram of a VCO with two control voltage inputs.

Those of skill in the art will note at least two structural differences between the PLLs of the inventive multi-PLL system of FIG. 1, and conventional PLLs. First, the Voltage Controlled Oscillators (VCOs) have both a primary and an auxiliary control input. FIG. 2 depicts an example circuit for a VCO with two control voltage inputs ($V_{CTRL1}$ and $V_{CTRL2}$). Second, at least some of the secondary PLLs (all of the ones shown in FIG. 1) include both first and second Charge Pumps (CP1, CP2). The structure and operation of both features is explained herein.

The primary PLL operates largely conventionally (other than the auxiliary control input to the VCO, which is described below). The primary PLL receives a reference periodic input signal (ref), such as a stable signal from a crystal oscillator or the like. The output of the VCO is divided by a divider circuit (DIV), which may be an integer or fractional divider (such as a delta-sigma modulator controlling the division number), to provide a divided periodic signal. The phase, and frequency, of the divided periodic signal is compared to that of the reference periodic signal in a Phase/Frequency Detector (PFD), which outputs, in the alternative, Charge Up or Charge Down pulses in response to one of the inputs leading or lagging the other. A Charge Pump (CP) generates a positive or negative current in response to the CU/CD pulses. A loop filter (LF) converts the CP output current to a voltage level, which is output as the primary VCO control input. In response to changes of the primary VCO control input, the VCO increases or decreases the frequency of its periodic output signal such that it remains a multiple of the reference periodic input signal (the multiple being equal to the divider value, or average divider value in case of a fractional divider). The output frequency of the primary PLL may be controlled by adjusting the frequency of the reference periodic input signal, adjusting the applied value of the (integer or fractional) divider, or both. The conventional analog charge-pump PLL is well known in the art and exhibits proven performance and robustness.

According to embodiments of the present invention, the primary VCO control input is output by the primary PLL, and is connected to, and forms the primary VCO control input of, the secondary PLLs. Accordingly, all PLLs in the system track the frequency of the primary PLL. However, in real-world implementations there will inevitably be some mismatches between the oscillators, causing their respective PLL output frequencies to deviate. This is compensated for by the secondary PLL control loops, forcing the phase of each secondary PLL output signal to lock to that of the primary PLL.

The bandwidth of the primary PLL is preferably set for best phase noise performance. A larger bandwidth causes increased output noise from the reference signal and in-band PLL noise sources, whereas a lower bandwidth causes increased output noise due to the VCO. Accordingly, there is an optimum bandwidth for phase noise. This bandwidth is typically rather limited, and a multi-PLL system with all loops limited to this bandwidth would not be effective in suppressing deleterious interactions due to coupling between the oscillators. To compensate, the secondary PLLs' control loops can have larger bandwidth than the primary PLL, and to reduce the impact of reference signal noise at increased bandwidth they are structured to lock to the phase of the primary PLL, rather than directly to the phase of the reference signal.

As shown in the embodiment of FIG. 1, each secondary PLL includes a VCO configured to generate an output periodic signal (at the frequency of the primary PLL VCO output), and a divider circuit configured to divide the output periodic signal to generate a local divided periodic signal. The divider value is the same as that for the primary PLL, and may be adjusted to implement frequency changes. At the PFD, each secondary PLL compares its local divided periodic signal to the divided periodic signal received from the primary PLL. According to the well-known operation of an analog PLL, if one of these PFD inputs leads or lags the other in phase, the PFD outputs, in the alternative, Charge Up (CU) or Charge Down (CD) pulses, the lengths of which are proportional to the PFD input signals' phase mismatch. A first Charge Pump (CP1) generates a positive or negative current in response to the CU/CD pulses, and a Loop Filter (LF) converts the CP current into a VCO control voltage. This control voltage is the auxiliary VCO control input (the primary VCO control input is received from the primary PLL).

The primary VCO control input received from the primary PLL thus drives the frequency of each secondary PLL's output periodic signal to track that of the primary PLL. Additionally, the control loop of each secondary PLL operates to lock the phase of its output periodic signal to that of the primary PLL output periodic signal. One advantage of using the primary PLL divided periodic signal for the phase comparison, rather than the primary PLL VCO output, is that the lower frequency signals can be routed with lower power and cause less interference on the IC. In this manner, robust PFDs can be realized with low power. Although the embodiment of FIG. 1 depicts all secondary PLLs being locked to the primary PLL phase, desired phase offsets may be created and maintained, such as by controlled (positive or negative) DC current injection at the CP outputs.

The bandwidth of the secondary PLL phase control loops can be made much higher than the frequency control loop of the primary PLL, because the reference signal is not present. In place of the reference signal, the divided periodic signal of the primary PLL is used as input signal, which has less high frequency phase noise than the reference signal, due to lowpass filtering of the primary PLL loop.

The VCO of the primary PLL may introduce phase deviations, referred to herein as phase noise. This will be sensed by the secondary PLLs, which include a second Charge Pump (CP2) to generate phase noise correction currents. Because each secondary PLL, being locked to the primary PLL, would normally drive its VCO to follow the primary PLL—that is, to propagate the phase noise—to counteract the phase noise, the phase noise correction current output by CP2 has a polarity opposite to the current output by CP1. The phase noise correction current is also scaled down, in one embodiment, by a factor related to the number of secondary PLLs configured to output a phase noise correction current. For example, if N secondary PLLs are configured to output a phase noise correction current, each may scale its phase noise correction CP2 current by 1/N (compared to the CP1 current), to provide an effective current to counter deviations in the primary PLL VCO, resulting in the same loop bandwidth as for the secondary PLL VCO deviations (assuming the loop filters in the secondary PLLs to have the same impedance as PNC-LF, and the tuning sensitivity of the second control input to be the same in the primary PLL VCO as in the secondary PLL VCOs).

The phase noise correction currents are summed together (for example, by connecting all CP2 outputs), and the resulting combined phase noise correction current is input to a Phase Noise Correction Loop Filter (PNC-LF). The PNC-LF converts the combined phase noise correction current into a voltage, and outputs it to the primary PLL for use as the auxiliary VCO control input. In this manner, phase noise caused by the Primary PLL VCO is detected and corrected by the secondary PLLs.

As an alternative to each secondary PLL scaling its phase noise correction current (e.g., by 1/N), PNC-LF can be scaled in impedance by 1/N. Preferably, the loop gain of the phase noise correction loop is the same as for the secondary PLL phase control loops. Where N paths work in parallel, either CP2 current or PNC-LF impedance should be scaled by 1/N, compared to the CP1 current and secondary PLL LF impedance, respectively. Alternatively, both can be scaled, by various combinations of values resulting in an overall scaling of 1/N. The proper scaling to achieve the desired loop gain, and which circuits to scale, are implementation details that can be derived, for a given implementation, by those of skill in the art, without undue experimentation, given the teachings of the present disclosure.

In one embodiment, the PNC-LF is distributed. Part of the PNC-LF is located close to the primary PLL VCO, to reduce potential high frequency interference picked up in the routing of the primary PLL auxiliary VCO control input. However, parts of the PNC-LF are located close to the secondary PLLs CP2 circuits that generate the phase noise correction currents, so that the high frequency current of the CP pulses travels a very short distance across the IC, and hence generates minimal interference. Similarly, in some embodiments the Loop Filter of the primary PLL (generating the first VCO control input) is distributed such that part of it is close to its associated Charge Pump in the primary PLL, to minimize travel distance of fast CP current pulses, and parts of it are near at least some of the VCOs in secondary PLLs, to suppress high frequency interference potentially picked up by the routing.

Figure 3:
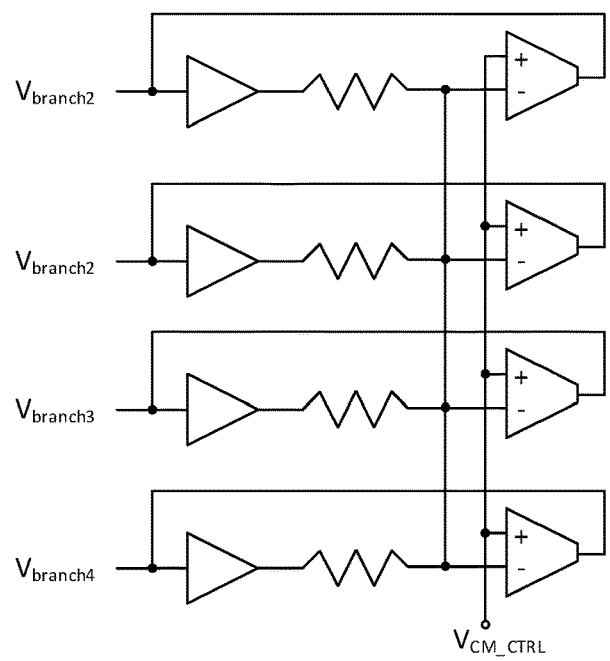
FIG. 3 is a schematic diagram of a common mode voltage control circuit.

A Common Mode (CM) voltage control circuit is necessary to prevent the secondary PLL auxiliary VCO control input levels from going out of bounds, as the phase control loops could then stop working properly. The CM voltage control circuit is connected to all second VCO control inputs, in both the primary and secondary PLLs. One representative implementation of the CM voltage control circuit is depicted in FIG. 3.

The amplifiers to the left are equal, voltage amplifiers with a voltage gain near unity, i.e. voltage followers. The amplifiers prevent resistors from loading the branch signals. The resistors are equal. In the node to the right of the resistors, where all signals are merged, since all amplifiers and resistors are equal and ideally linear, is a representation of the average of all branch voltages, i.e., the common mode voltage. If the voltage followers are ideal with a voltage gain of unity and no offset voltage, this voltage is the actual average, otherwise it is a representation of it. This representation is compared to a target value $V_{CM\_CTRL}$ in transconductance amplifiers. A current proportional to the difference from the target voltage is fed back to each input. The transconductance amplifiers are equal, so equal currents are fed back to all inputs, i.e., the feedback signal is a common mode signal. The common mode voltage control circuit hence detects the common mode voltage level, and feeds back a common mode current to counteract deviations from the target level. At each input is a loop filter of the PLL system (not shown in FIG. 3). That loop filter converts the feedback current into voltage. The low pass characteristic of that filter will then shape the loop gain of the common mode feedback, and stability can be ensured.

The reference periodic input signal (ref) is preferably at a higher frequency than typical, to allow a high bandwidth in the phase control loops. This will provide better rejection of undesired interaction between VCOs due to coupling, and it will suppress uncorrelated noise between VCOs up to a higher frequency offset. At offset frequencies where the phase noise correction loop gain is high, the VCOs will lock to a common mode and then behave as a single oscillator with the phase noise improved by $10 \cdot \log(N+1)$ dB compared to a single oscillator, where N+1 is the number of VCOs. Alternatively, in one embodiment where a high frequency reference periodic input signal is not available, the primary PLL features a separate frequency divider, with a lower division number than the first, which is used for the phase control loops. The secondary PLLs then use the lower division number. The effective reference frequency of the phase noise correction loops is thus increased. In one embodiment, the feedback divider of the primary PLL is a cascade of frequency dividers, and a higher frequency is tapped off for the secondary PLL loops.

Figure 4:
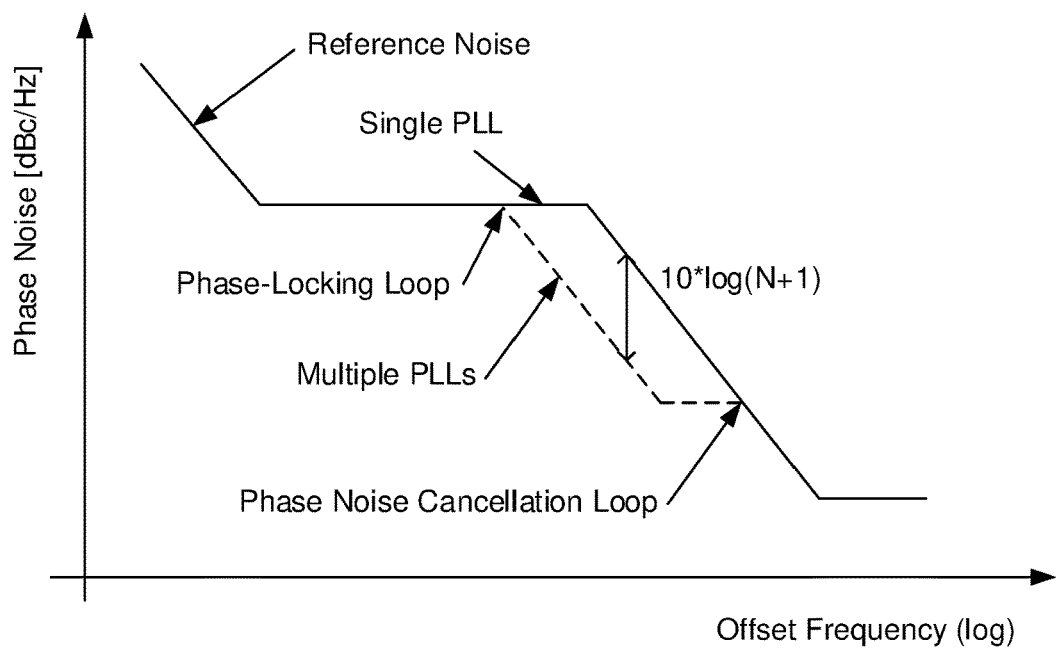
FIG. 4 is a single-sideband phase noise graph of conventional and multi-PLLs.

Common practice for PLL bandwidth is not to exceed about 1/10 of the reference frequency, which is a reasonable guideline for the multi-PLL system of FIG. 1. If the reference frequency is around 200 MHz, the bandwidth of the secondary phase locked loops could be about 20 MHz. Up to that frequency, the VCO phase differences will be suppressed and the VCOs will behave as one, with suppressed interaction due to coupling and suppressed uncorrelated phase noise. FIG. 4 shows the phase noise at the output of a single PLL, compared to the phase noise of an output of the multi-PLL system of FIG. 1. As the graph shows, the multi-PLL system of embodiments of the present invention improves phase noise by effectively reducing the VCO noise. When the phase noise cancellation mode loop gain is high, the improvement in the VCO-dominated phase noise region is close to $10 \cdot \log(N+1)$, since the different VCOs are locked together to effectively behave as a single VCO with N+1 times the signal energy.

Figure 5:
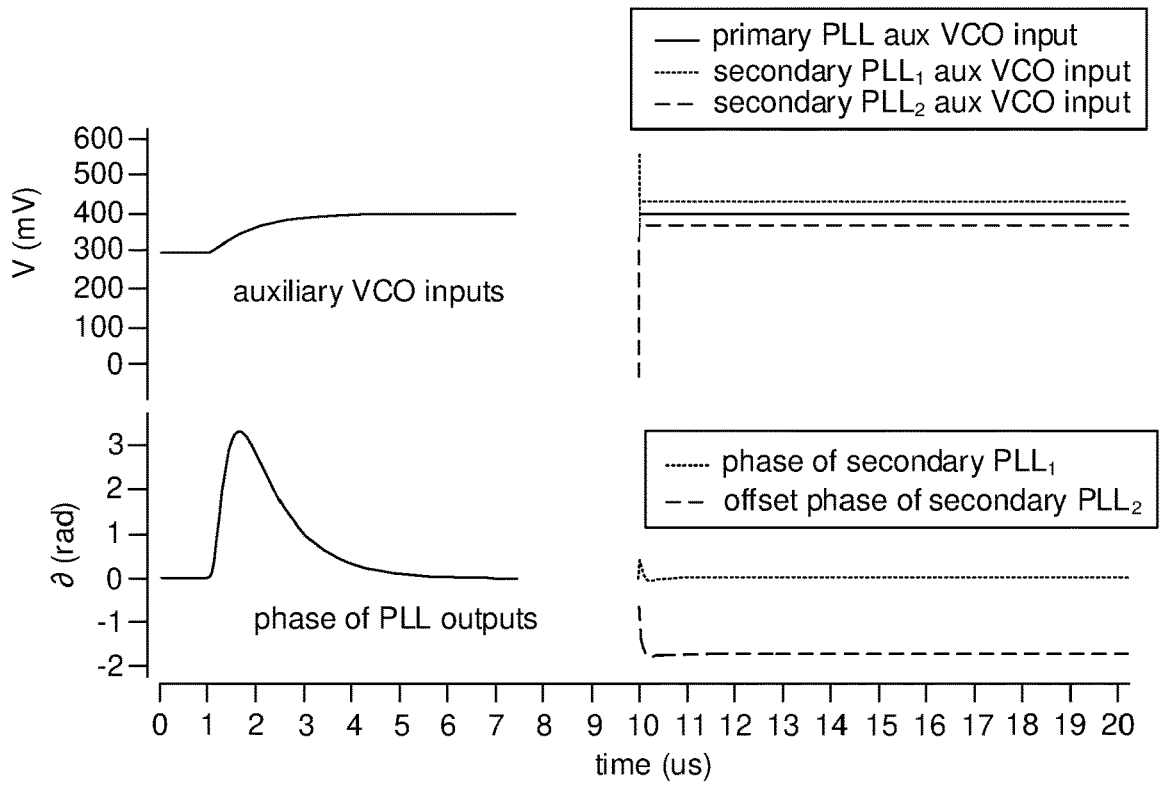
FIG. 5 is a graph of simulations showing the transient response and phase offset of a multi-PLL system.

FIG. 5 depicts graphs of the simulations of two events in a multi-PLL system comprising one primary PLL and two secondary PLLs. To the left, at the simulation time 1 µs, a is step applied to the common mode target voltage $V_{CM\_CTRL}$ (see FIG. 3), which effectively raises the voltage of the first VCO control inputs at all of the PLLs. Because the CM voltage control circuit controls all of the auxiliary VCO control inputs together, all three curves are "stacked" in this graph, appearing to be a single curve. These curves can be seen in the upper graph. The lower graph shows the corresponding transient phase change of the PLL outputs, which the phase locking loops quickly drive back to zero.

To the right in FIG. 5, at simulation time 10 µs, the graphs show a deliberate phase offset being introduced into one secondary PLL, such as by adding (positive or negative) DC current to the output of its charge pump CP1 and preferably also opposite polarity current to the output of CP2. The lower graph shows the phase of that PLL differing from the other two (stacked), after a very short transient, and then maintaining this constant phase offset. In prior art PLL designs, where the PLLs are positioned in close proximity on the IC, mutual inductive coupling between the VCOs causes instability. The upper right-hand graph of FIG. 5 shows that the second VCO control inputs of the secondary PLLs settle to values slightly different than that of the primary PLL, to counteract the effect of this mutual inductive coupling, achieving the stable state depicted in the lower right-hand graph.

Figure 6:
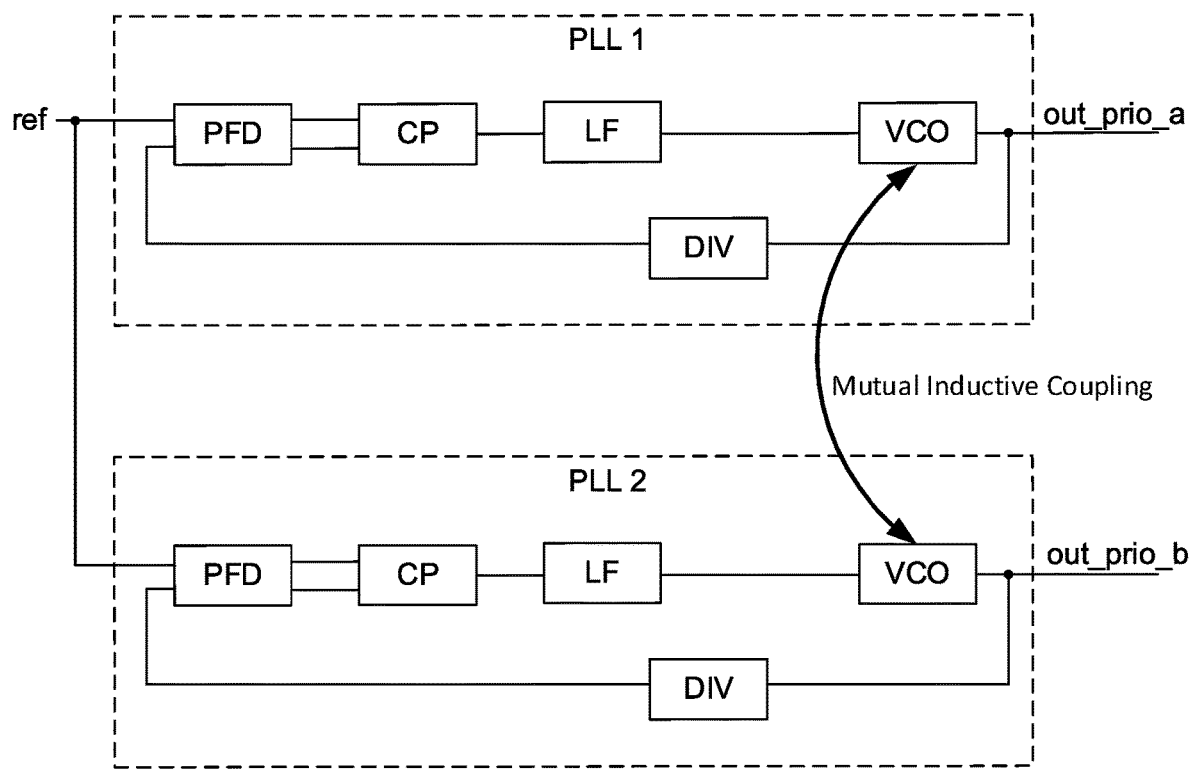
FIG. 6 is a schematic diagram of a prior art dual-PLL configuration.
Figure 7:
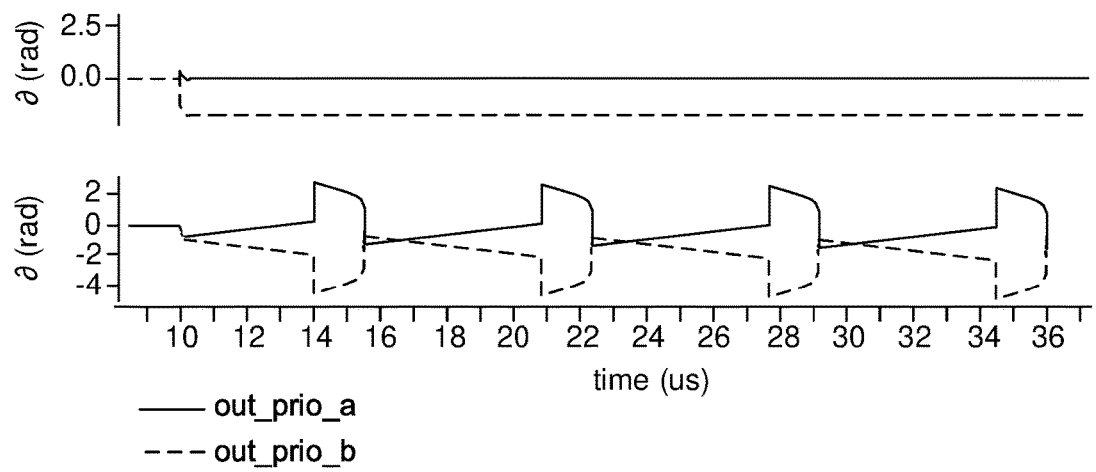
FIG. 7 is a graph showing the phase offset stability of the multi-PLL system and oscillation of a prior art dual-PLL.

FIG. 6 is a schematic block diagram of a conventional solution—two (or more) PLLs, each receiving the same reference signal, and each independently generating an output. If the two PLL circuits are located on the same integrated circuit, or close together on a printed circuit board, mutual inductive coupling occurs between the VCO circuits, which deleteriously affects phase stability FIG. 7 depicts a comparison of simulated phase offsets in an inventive multi-PLL system in the upper graph, and in the conventional dual-PLL circuit of FIG. 6 in the lower graph. The upper graph of the multi-PLL system is nearly identical to the lower right side of FIG. 5—the output of one secondary PLL is set to a phase offset, and it locks to that offset and is stable. The lower graph of FIG. 6 shows the unstable phase oscillation that occurs due to mutual inductive coupling between VCOs in the conventional PLLs.

Figure 8:
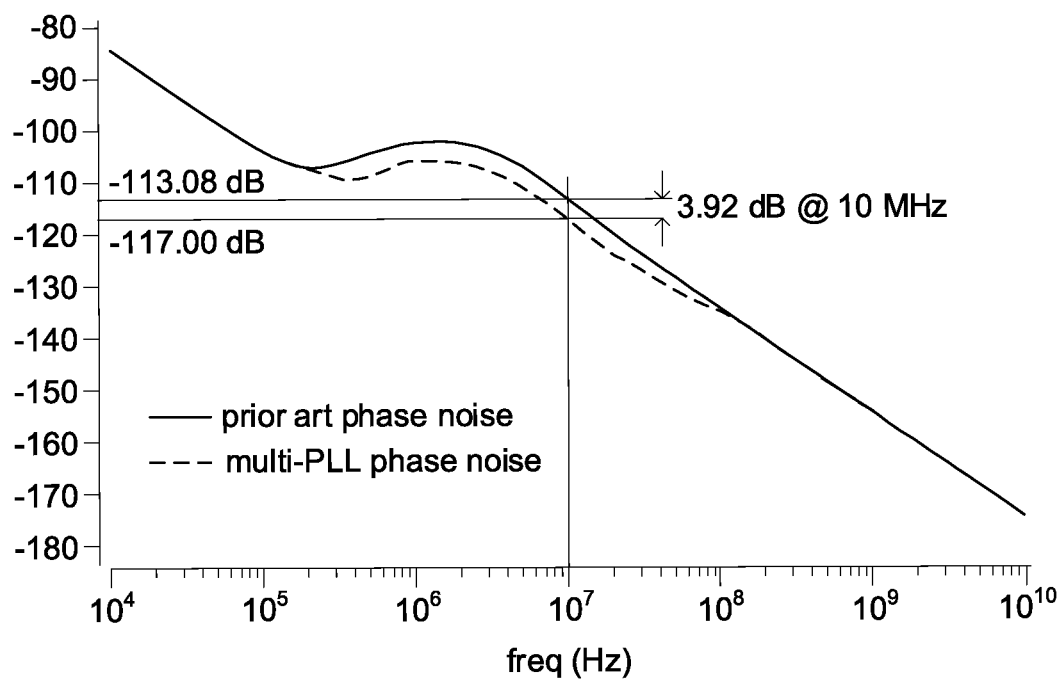
FIG. 8 is a graph of the phase noise of the multi-PLL system and a prior art PLL as a function of frequency.

FIG. 8 is a graph of phase noise suppression simulations comparing the multi-PLL system of FIG. 1 to a set of conventional PLLs. Due to the phase noise suppression loop, the phase noise of the multi-PLL system is suppressed from about 110 kHz to about 140 MHZ, achieving a suppression of 3.92 dB at 10 MHz.

Figure 9:
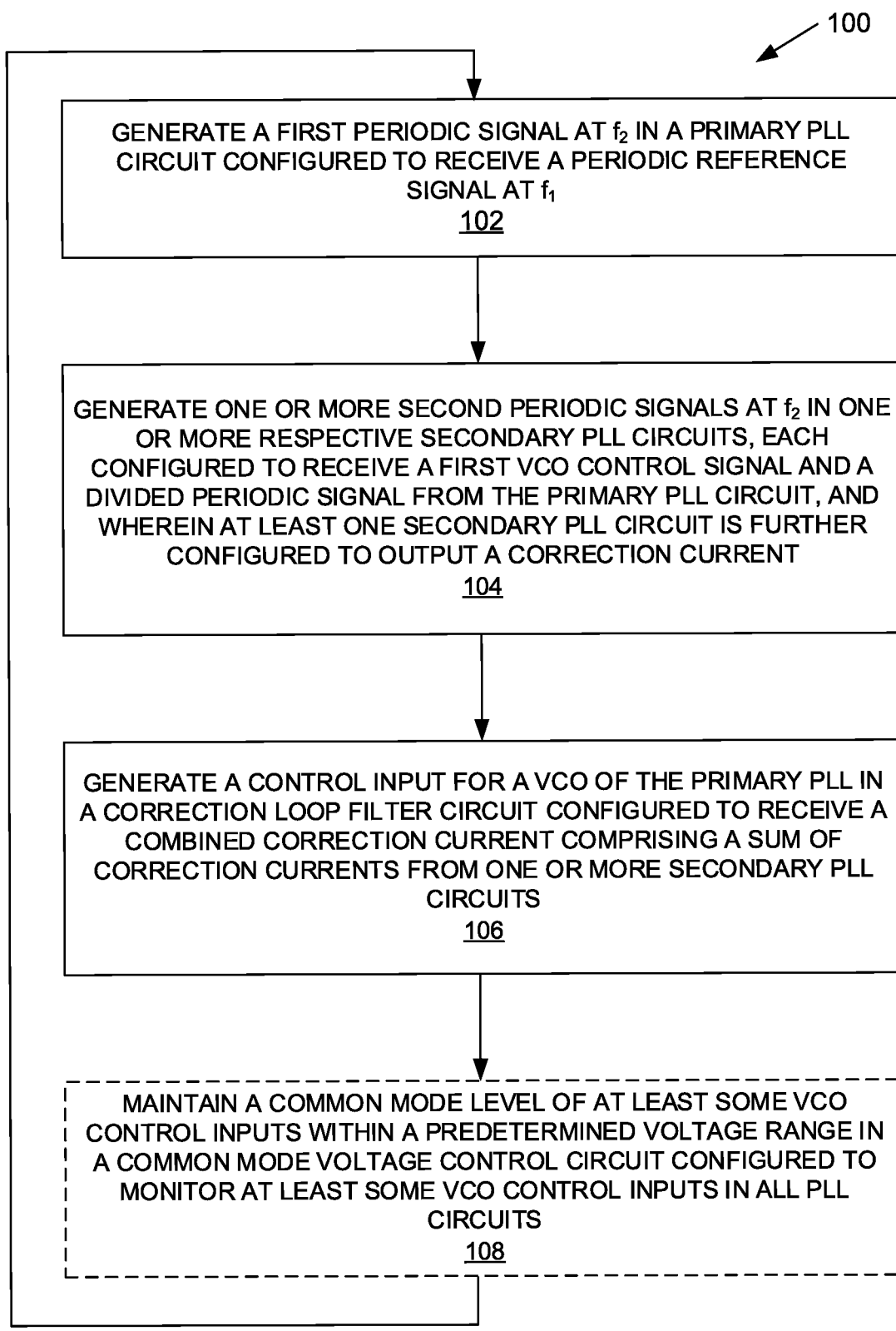
FIG. 9 is a flow diagram of a method of generating a plurality of periodic signals on an integrated circuit.

FIG. 9 depicts the steps in a method 100 of generating a plurality of periodic signals on an integrated circuit, each having the same frequency and phase. Although depicted as discrete steps performed in sequence, those of skill in the art will recognize that the method is ongoing and continuous, and all of the method steps occur in parallel. A first periodic signal is generated at a second frequency $f_2$ in a primary PLL circuit. The primary PLL is configured to receive a periodic reference signal at a first frequency $f_1$, wherein the second frequency is higher than the first frequency (i.e., $f_2 > f_1$) (block 102). One or more second periodic signals is generated at the second frequency $f_2$, and having the same phase as the first periodic signal, in one or more respective secondary PLL circuits. Each secondary PLL circuit is configured to receive a primary VCO control input, and a divided periodic signal, from the primary PLL circuit. At least one secondary PLL circuit is further configured to output a phase noise correction current (block 104). The phase noise correction current has a polarity opposite that of a current generated by the other charge pump. A phase noise correction control input for a VCO of the primary PLL is generated in a phase noise correction loop filter circuit. The phase noise correction loop filter circuit is configured to receive a combined phase noise correction current comprising a sum of phase noise correction currents from one or more secondary PLL circuits (block 106). Either the combined phase noise correction current or the impedance of the phase noise correction loop filter circuit is scaled based on the number of secondary PLL circuits contributing to the combined phase noise correction current. Optionally (as indicated by dashed lines), the common mode level of at least some VCO control inputs are maintained within a predetermined voltage range by a common mode voltage control circuit configured to monitor auxiliary VCO control inputs in all PLL circuits (block 108).

FIG. 10A is a diagram of MIMO transmission over the air interface of a wireless communication network. A User Equipment (UE) 10, such as a smartphone, receives and transmits modulated Radio Frequency (RF) signals, over multiple antennas, from and to a base station 20, such as an LTE eNB or an NR gNB. The RF signals 30a, 30b employ spatial diversity and/or spatial multiplexing to increases robustness against fading or co-channel interference, and to improve bitrates, by transmitting on separate paths between respective multiple antennas at the UE 10 and base station 20. The RF signals 30a, 30b may be in the millimeter wave frequency bands. Although only two RF signals 30a, 30b are shown, in general MIMO transmissions may comprise multiple separate transmissions (e.g., 2, 4, 8, . . . , 128, or more). At each of the UE 10 and base station 20, multiple transceivers, associated with the multiple antennas, receive and transmit RF signals. These transceivers require multiple phase-locked Local Oscillator (LO) signals for accurate frequency conversion. Additionally or alternatively, one or both of the UE 10 and base station 20 may implement beamforming, wherein the directionality of Tx or Rx antenna beams is increased and controlled by controlling the phase of multiple antenna elements in a phased array antenna. In this application also, multiple transceivers each require a phase-locked LO signal.

FIG. 10B is a block diagram of the UE 10 of FIG. 10A. As used herein, the term UE may refer to a user-operated telephony terminal, a machine-to-machine (M2M) device, a machine-type communications (MTC) device, a Narrowband Internet of Things (NB-IoT) device (in particular a UE implementing the 3GPP standard for NB-IoT), etc. A UE 10 may also be referred to as a radio device, a radio communication device, a wireless communication device, a wireless terminal, or simply a terminal-unless the context indicates otherwise, the use of any of these terms is intended to include device-to-device UEs or devices, machine-type devices or devices capable of machine-to-machine communication, sensors equipped with a radio network device, wireless-enabled table computers, mobile terminals, smartphones, laptop-embedded equipped (LEE), laptop-mounted equipment (LME), USB dongles, wireless customer-premises equipment (CPE), and the like.

The UE 10 transmits and receives RF signals (including MIMO signals), which may for example be in the millimeter wave frequency bands, on at least one antenna 13, which may be internal or external, as indicated by dashed lines. The RF signals are generated and received by one or more transceiver circuits 12. At least one transceiver circuit 12 includes a multi-PLL system according to embodiments of the present invention, such as to generate a plurality of phase-locked LO signals. The transceiver circuits 12, as well as other components of the UE 10, are controlled by processing circuitry 14. Memory 16 operatively connected to the processing circuitry 14 stores software in the form of computer instructions operative to cause the processing circuitry 14 to execute various procedures. A user interface 18 may include output devices such as a display and speakers (and/or a wired or wireless connection to audio devices such as ear buds), and/or input devices such as buttons, a keypad, a touchscreen, and the like. As indicated by the dashed lines, the user interface 18 may not be present in all UEs 10; for example, UEs 10 designed for Machine Type Communications (MTC) such as Internet of Things (IoT) devices, may perform dedicated functions such as sensing/measuring, monitoring, meter reading, and the like, and may not have any user interface 18 features.

FIG. 10C is a block diagram of the base station 20 of FIG. 10A. A base station 20—known in various network implementations as a Radio Base Station (RBS), Base Transceiver Station (BTS), Node B (NB), enhanced Node B (eNB), Next Generation Node B (gNB), or the like—is a node of a wireless communication network that implements a Radio Access Network (RAN) in a defined geographic area called a cell, by providing radio transceivers to communicate wirelessly with a plurality of UEs 10.

The base station 20 transmits and receives RF signals (including MIMO signals), which may for example be in the millimeter wave frequency bands, on a plurality of antennas 23. As indicated by the broken line, the antennas 23 may be located remotely from the base station 20, such as on a tower or building. The RF signals are generated and received by one or more transceiver circuits 22. At least one transceiver circuit 22 includes a multi-PLL system according to embodiments of the present invention, such as to generate a plurality of phase-locked LO signals. The transceiver circuits 22, as well as other components of the base station 20, are controlled by processing circuitry 24. Memory 26 operatively connected to the processing circuitry 24 stores instructions operative to cause the processing circuitry 24 to execute various procedures. Although the memory 26 is depicted as being separate from the processing circuitry 24, those of skill in the art understand that the processing circuitry 24 includes internal memory, such as a cache memory or register file. Those of skill in the art additionally understand that virtualization techniques allow some functions nominally executed by the processing circuitry 24 to actually be executed by other hardware, perhaps remotely located (e.g., at a data center in the so-called "cloud"). Communication circuitry 28 provides one or more communication links to one or more other network nodes, propagating communications to and from UEs 10, from and to other network nodes or other networks, such as telephony networks or the Internet.

In all embodiments, the processing circuitry 14, 24 may comprise any sequential state machine operative to execute machine instructions stored as machine-readable computer programs in memory 16, 26, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

In all embodiments, the memory 16, 26 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the transceiver circuits 12, 22 are operative to communicate with one or more other transceivers via a Radio Access Network (RAN) according to one or more communication protocols known in the art or that may be developed, such as IEEE 802. xx, CDMA, WCDMA, GSM, LTE, UTRAN, WiMax, NB-IoT, or the like. The transceiver 12, 22 implements transmitter and receiver functionality appropriate to the RAN links (e.g., frequency allocations and the like). The transmitter and receiver functions may share circuit components and/or software, or alternatively may be implemented separately.

In all embodiments, the communication circuitry 28 may comprise a receiver and transmitter interface used to communicate with one or more other nodes over a communication network according to one or more communication protocols known in the art or that may be developed, such as Ethernet, TCP/IP, SONET, ATM, IMS, SIP, or the like. The communication circuits 28 implement receiver and transmitter functionality appropriate to the communication network links (e.g., optical, electrical, and the like). The transmitter and receiver functions may share circuit components and/or software, or alternatively may be implemented separately.

Figure 11:
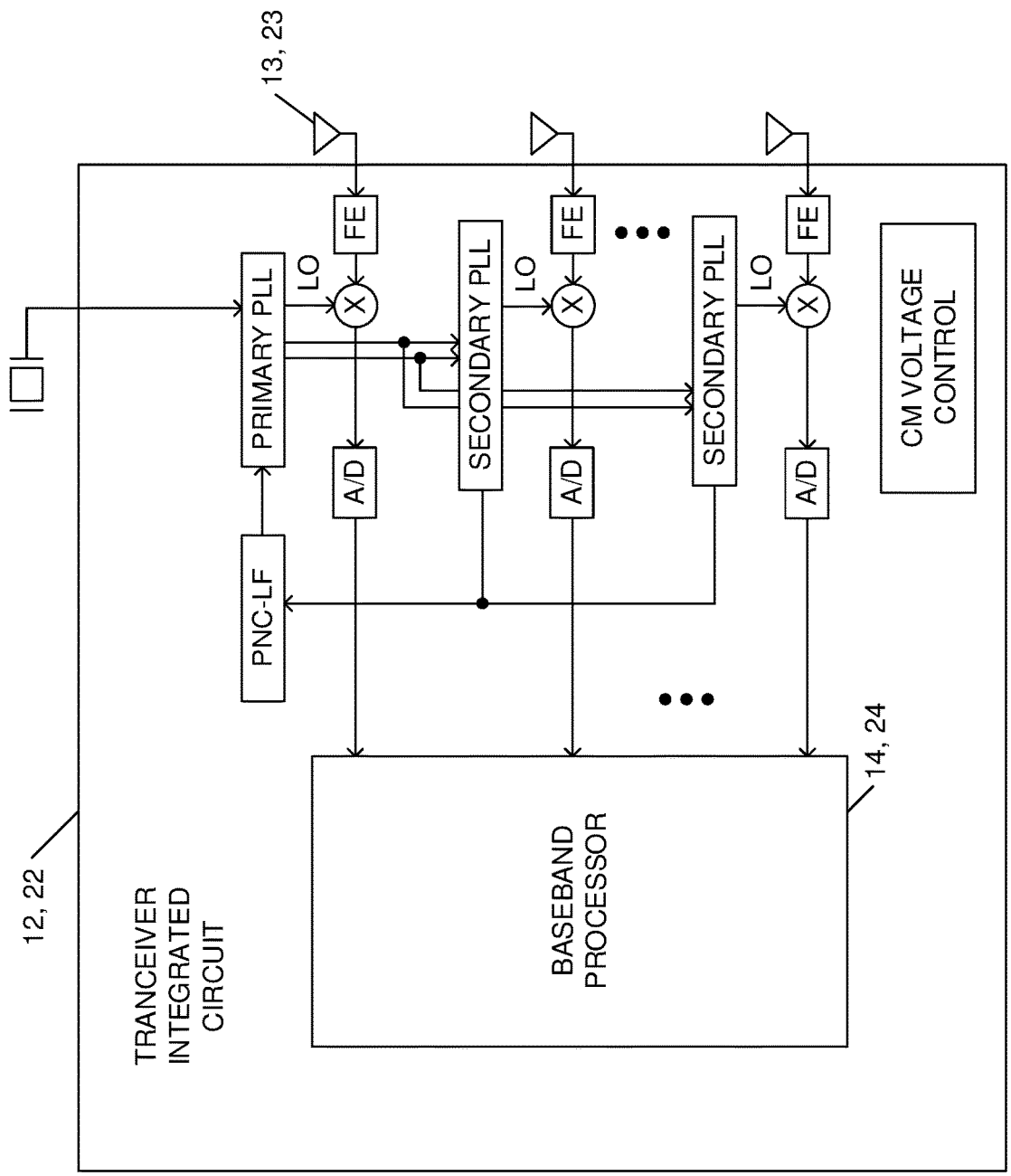
FIG. 11 is a functional block diagram of some receiver components of a transceiver integrated circuit.

FIG. 11 depicts some receiver circuitry of a transceiver 12, 22 implemented on an Integrated Circuit (IC) in the UE 10 or base station 20 of FIG. 10B, 10C, respectively. For simplicity, transmission circuits are not depicted. RF signals received at each of a plurality of antennas 13, 23 are processed by RF Front End (FE) circuitry, which may for example include Low Noise Amplification, filtering, and the like. The received signals are frequency downconverted by mixing with a Local Oscillator (LO) signal at a mixer, and digitized by Analog-to-Digital (A/D) converters. The downconverted digital signals are then processed by baseband processor 14, 24.

The LO signals at each mixer are preferably phase locked for efficient, low power processing of received signals, and for the transmission of coherent signals from multiple antennas. According to embodiments of the present invention, this is ensured by a multi-PLL system of LO generation. The multi-PLL system comprises one primary PLL, a plurality of secondary PLLs (two, in FIG. 11), a Phase Noise Cancellation Loop Filter (PNC-LF), and a common mode (CM) voltage control circuit.

The primary PLL receives a periodic reference signal, such as a clock signal from a crystal oscillator. The primary PLL outputs its primary VCO control input to each secondary PLL, thus setting the secondary PLL outputs to nearly the same LO frequency. Additionally, to phase-lock the secondary PLL outputs to that of the primary PLL, the primary PLL outputs its divided periodic signal to each secondary PLL. The relatively lower frequency of the divided periodic signal allows for low power distribution of the signals on the IC, and minimizes interference. The secondary PLLs compare their local divided periodic signal to the divided periodic signal received from the primary PLL, and operate a conventional PLL loop (PFD, CP1, LF, VCO, DIV) to generate an auxiliary VCO control signal, which forces the phase of their output periodic signals to match the phase of the primary PLL output periodic signal.

At least one secondary PLL (all of them in FIG. 11) is configured to output a phase noise cancellation current, which is the polarity-inverted and (optionally) scaled-down output of a second charge pump (CP2) receiving CU/CD pulses from the PFD. These phase noise cancellation currents are summed (such as by connecting them together), and input to the PNC-LF. The PNC-LF converts the combined phase noise cancellation current to an auxiliary VCO control input, which corrects the primary PLL VCO for phase noise detected by the secondary PLLs.

The multi-PLL system is described herein with all secondary PLLs in the system configured to output a phase noise cancellation current. However, this is not a requirement of embodiments of the present invention. For example, one or more secondary PLLs on the IC may be frequencyand phase-locked to the primary PLL, but may not include (or may include but not operate) a second charge pump. So long as at least one secondary PLL participates in the phase noise cancellation loop, at least some benefits of phase noise cancellation accrue.

Those skilled in the art will also appreciate that embodiments herein further include corresponding computer programs.

A computer program comprises instructions which, when executed on at least one processor of an apparatus, cause the apparatus to carry out any of the respective processing described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of an apparatus, cause the apparatus to perform as described above.

Embodiments further include a computer program product comprising program code portions for performing the steps of any of the embodiments herein when the computer program product is executed by a computing device. This computer program product may be stored on a computer readable recording medium.

Embodiments of the present invention present numerous advantages over PLLs known in the art. A distributed LO signal generation system, with local PLLs and routing of a lower frequency reference signal, is attractive for power consumption. Also, the use of multiple localized high frequency sources enables modularity of design. The PLLs in the inventive distributed LO generation system are locked to each other with high bandwidth, reduced phase noise, and reduced or eliminated effects of oscillator coupling—all without sacrificing the design modularity. The bandwidth of the primary PLL loop is set independently of the bandwidth of the phase locking loops in the secondary PLLs, which enables optimization of phase noise performance while still suppressing oscillator coupling effects. The multi-PLL system is based on the analog charge-pump PLL, which is a well-proven, high-performance, low-power, and robust architecture. Embodiments of the present invention thus provide: reduced effects of oscillator interaction; reduced phase noise, both in-band and out-of-band; well-proven PLL architecture with PFD and CP; no additional high frequency signal distribution (preserving design modularity); and the option of phase offsets between PLLs by loop filter current injection (or other known methods).

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features, and advantages of the enclosed embodiments will be apparent from the description.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein. As used herein, the term "configured to" means set up, organized, adapted, or arranged to operate in a particular way; the term is synonymous with "designed to." As used herein, the term "substantially" means nearly or essentially, but not necessarily completely; the term encompasses and accounts for mechanical or component value tolerances, measurement error, random variation, and similar sources of imprecision.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The invention claimed is:

1. A system, comprising:
a primary Phase Locked Loop (PLL) circuit configured to receive a periodic reference signal at a first frequency and to output a first periodic signal at a second frequency, the primary PLL circuit comprising a primary Voltage Controlled Oscillator, (VCO) circuit configured to output the first periodic signal at the second frequency dependent on a first VCO control signal generated in the primary PLL and applied at a first VCO input of the primary VCO circuit;
a plurality of secondary PLL circuits, each configured to receive a divided periodic signal from the primary PLL circuit, and to output a respective periodic signal at the second frequency, each secondary PLL circuit comprising a respective secondary VCO circuit configured to output the respective periodic signal at the second frequency dependent on the first VCO control signal applied at a first VCO input of the secondary VCO circuit and a second VCO control signal generated in the secondary PLL and applied at a second VCO input of the secondary VCO circuit;
wherein at least one secondary PLL circuit is further configured to output a correction current;
a correction loop filter circuit configured to receive a combined correction current comprising a sum of correction currents from one or more secondary PLL circuits, and output a third VCO control signal to a second VCO input of the primary PLL circuit;
wherein the primary VCO circuit is further configured to output the first periodic signal dependent on the third VCO control signal.

2. The system of claim 1 further comprising:
a common mode voltage control circuit configured to monitor at least some VCO control signals in all PLL circuits, and to maintain a common mode level of the monitored VCO control signals within a predetermined voltage range.

3. The system of claim 1 wherein a loop filter circuit of the primary PLL circuit is distributed such that a portion of the loop filter circuit is proximate a charge pump in the primary PLL circuit, and portions of the loop filter circuit are proximate the VCO in at least one secondary PLL circuit.

4. The system of claim 1 wherein each secondary PLL circuit is configured to:
generate a local divided periodic signal by dividing its respective periodic signal by a predetermined factor;
compare the local divided periodic signal to the divided periodic signal received from the primary PLL circuit; and
in response to the comparison, adjust the VCO of the secondary PLL circuit to lock its respective periodic signal to the phase of the first periodic signal output by the primary PLL circuit.

5. The system of claim 4 wherein each secondary PLL circuit comprises:
a secondary VCO configured to receive the first VCO control input from the primary PLL circuit at a first VCO input of the secondary VCO, and to generate the respective periodic output signal at the second frequency;
a divider circuit configured generate the local divided periodic signal by dividing the respective periodic output signal by a same factor as the primary PLL circuit;
a phase/frequency detector circuit configured to generate Charge Up or Charge Down pulse signals in response to a phase or frequency difference between the local divided periodic signal and the divided periodic signal received from the primary PLL circuit;
a first charge pump circuit configured to generate a first charge pump output current in response to the Charge Up or Charge Down signals; and
a loop filter circuit configured to generate a second VCO control signal in response to the first charge pump output current, and to provide the second VCO control signal to a second VCO input of the secondary VCO.

6. The system of claim 5 wherein one or more secondary PLL circuits are further configured to, in response to the comparison, output a correction current, and each comprises:
a second charge pump circuit configured to output the correction current dependent on the Charge Up or Charge Down signals;
wherein the correction current has an inverse polarity relative to the first charge pump output current.

7. The system of claim 6 wherein the correction current is scaled to be less than the first charge pump output current by a factor related to the number of secondary PLL circuits configured to output a correction current.

8. The system of claim 6 wherein the correction loop filter circuit has an impedance related to the number of secondary PLL circuits configured to output a correction current.

9. A method of generating a plurality of periodic signals, each having the same frequency, comprising:
generating a first periodic signal at a second frequency in a primary Phase Locked Loop (PLL) circuit configured to receive a periodic reference signal at a first frequency;
generating one or more respective periodic signals at the second frequency in one or more respective secondary PLL circuits, each configured to receive a first Voltage Controlled Oscillator (VCO) control signal and a divided periodic signal from the primary PLL circuit, and wherein at least one secondary PLL circuit is further configured to output a correction current;
generating a control input for a VCO of the primary PLL in a correction loop filter circuit configured to receive a combined correction current comprising a sum of correction currents from one or more secondary PLL circuits.

10. The method of claim 9 further comprising:
maintaining a common mode level of at least some VCO control inputs within a predetermined common mode voltage range in a common mode voltage control circuit configured to monitor at least some VCO control inputs in all PLL circuits.

11. The method of claim 9 wherein a loop filter circuit of the primary PLL circuit is distributed such that a portion of the loop filter circuit is proximate a charge pump in the primary PLL circuit, and portions of the loop filter circuit are proximate at least one secondary PLL circuit.

12. The method of claim 9 wherein generating a respective periodic signal in a secondary PLL circuit comprises:
dividing the respective periodic output signal of the secondary PLL circuit by a predetermined factor to generate a local divided periodic signal;
comparing the local divided periodic signal to the divided periodic signal received from the primary PLL; and
in response to the comparison, adjusting a VCO circuit to lock the a phase of the respective periodic signal output by the secondary PLL circuit to the a phase of the first periodic signal output by the primary PLL circuit.

13. The method of claim 12 wherein, in the secondary PLL circuit:
generating a respective periodic signal at the second frequency is performed by a VCO configured to receive, at a first input, a first VCO control input from the primary PLL; and
generating the local divided periodic signal is performed by a divider circuit configured to divide the respective periodic signal by a same factor as the primary PLL circuit;
and further comprising:
generating Charge Up or Charge Down pulse signals in response to a phase or frequency difference between the local divided periodic signal and the divided periodic signal received from the primary PLL circuit, in a phase/frequency detector circuit;
generating a first charge pump output current in response to the Charge Up or Charge Down signals in a first charge pump circuit; and
generating a second VCO control input in response to the first charge pump output current in a loop filter circuit, and providing the second VCO control input to a second input of the secondary PLL circuit VCO.

14. The method of claim 13 further comprising, in one or more secondary PLL circuits, outputting a correction current in response to the comparison, wherein:
generating a correction current is performed by a second charge pump circuit configured to output the correction current in response to the Charge Up or Charge Down signals; and
the correction current has an inverse polarity relative to the first charge pump output current.

15. The method of claim 14 further comprising scaling the correction current to be less than the first charge pump output current by a factor related to the number of secondary PLL circuits configured to output a correction current.

16. The method of claim 9 wherein the correction loop filter circuit has an impedance related to the number of secondary PLL circuits configured to output a correction current.

17. The method of claim 9 wherein generating a correction control input for a VCO of the primary PLL circuit is performed by a distributed correction loop filter circuit, wherein portions of the correction loop filter circuit are proximate at least one secondary PLL circuit configured to output a correction current, and a portion of the correction loop filter circuit is proximate the primary PLL circuit.

18. User Equipment, UE, operative in a wireless communication network, the UE including one or more transceiver circuits comprising:
- a primary Phase Locked Loop (PLL) circuit configured to receive a periodic reference signal at a first frequency and to output a first periodic signal at a second frequency, the primary PLL circuit comprising a primary Voltage Controlled Oscillator (VCO) circuit configured to output the first periodic signal at the second frequency dependent on a first VCO control signal generated in the primary PLL and applied at a first VCO input of the primary VCO circuit;
- a plurality of secondary PLL circuits, each configured to receive a divided periodic signal from the primary PLL circuit, and to output a respective periodic signal at the second frequency, each secondary PLL circuit comprising a respective secondary VCO circuit configured to output the respective periodic signal at the second frequency dependent on a first VCO control signal generated in the secondary PLL and applied at a first VCO input of the secondary VCO circuit and a second VCO control signal applied at a second VCO input of the secondary VCO circuit;
- wherein at least one secondary PLL circuit is further configured to output a correction current;
- a correction loop filter circuit configured to receive a combined correction current comprising a sum of correction currents from one or more secondary PLL circuits, and output a third VCO control signal to a second VCO input of the primary PLL circuit;
- wherein the primary VCO circuit is further configured to output the first periodic signal dependent on the third VCO control signal.

19. A base station operative in a wireless communication network, the base station including one or more transceiver circuits comprising:
- a primary Phase Locked Loop (PLL) circuit configured to receive a periodic reference signal at a first frequency and to output a first periodic signal at a second frequency, the primary PLL circuit comprising a primary Voltage Controlled Oscillator (VCO) circuit configured to output the first periodic signal at the second frequency dependent on a first VCO control signal generated in the primary PLL and applied at a first VCO input of the primary VCO circuit;
- a plurality of secondary PLL circuits, each configured to receive a divided periodic signal from the primary PLL circuit, and to output a respective periodic signal at the second frequency, each secondary PLL circuit comprising a respective secondary VCO circuit configured to output the second periodic signal at the second frequency dependent on a first VCO control signal generated in the secondary PLL and applied at a first VCO input of the secondary VCO circuit and a second VCO control signal applied at a second VCO input of the secondary VCO circuit;
- wherein at least one secondary PLL circuit is further configured to output a correction current;
- a correction loop filter circuit configured to receive a combined correction current comprising a sum of correction currents from one or more secondary PLL circuits, and output a third VCO control signal to a second VCO input of the primary PLL circuit;
- wherein the primary VCO circuit is further configured to output the first periodic signal dependent on the third VCO control signal.

* * * * *